United States Patent [19]

Tsushima

[11] Patent Number: 4,845,375
[45] Date of Patent: Jul. 4, 1989

[54] CONTACT PHOTOELECTRIC CONVERSION APPARATUS HAVING PLURALITY OF PROTECTING LAYERS

[75] Inventor: Shuichi Tsushima, Takaidohigashi, Japan

[73] Assignee: Ricoh Company, Ltd., Tokyo, Japan

[21] Appl. No.: 122,744

[22] Filed: Nov. 19, 1987

[30] Foreign Application Priority Data

Nov. 26, 1986 [JP] Japan .................. 61-279801

[51] Int. Cl.$^4$ .............................................. H01J 40/14
[52] U.S. Cl. .................. 250/578; 250/211 J; 357/72; 357/30
[58] Field of Search ............... 250/578, 211 J; 358/294, 213.11, 213.13; 357/72, 30 D, 30 R

[56] References Cited

U.S. PATENT DOCUMENTS 4,189,753  2/1980  Parsons et al. ............. 358/213.11
4,446,364  5/1984  Hayashi et al. ............. 250/211 R

FOREIGN PATENT DOCUMENTS 54-41474  12/1979  Japan .
55-44470  11/1980  Japan .

Primary Examiner—David C. Nelms
Assistant Examiner—Eric F. Chatmon
Attorney, Agent, or Firm—Oblon, Spivak, McClelland, Maier & Neustadt

[57] ABSTRACT

A photoelectric conversion apparatus comprises an insulating and transparent substrate, a plurality of photoelectric conversion elements formed on the substrate in a line, selection switches made up of thin film transistors formed on the substrate for selecting the photoelectric conversion elements, a driving circuit made up of thin film transistors formed on the substrate for driving the selection switches, and a wear-resistant and transparent protecting layer formed at least on the photoelectric conversion elements.

11 Claims, 3 Drawing Sheets

CONTACT PHOTOELECTRIC CONVERSION APPARATUS HAVING PLURALITY OF PROTECTING LAYERS

BACKGROUND OF THE INVENTION

The present invention generally relates to contact photoelectric conversion apparatuses, and more particularly to a contact photoelectric conversion apparatus for use in converting into an electric signal images of characters, figures and the like optically read on a facsimile machine, a copying machine, an optical character reading apparatus, an electronic blackboard and the like.

Apparatuses for carrying out a photoelectric conversion by making contact with a document surface and the like are disclosed in Japanese Published Patent Applications No.54-41474 and No.55-44470, for example. In these apparatuses, a plurality of electrodes are formed at constant intervals on a transparent substrate made of glass or the like, and a film of a photoelectric conversion medium is formed on the electrodes. The side of the substrate provided with the photoelectric conversion medium makes contact with the document and the like, and the document is illuminated through the substrate so that an electrical signal in accordance with an electrical characteristic change of the photoelectric conversion medium dependent on a reflected light from the document is obtained from the electrode pairs.

However, according to these apparatuses, a photoelectric conversion part comprising the photoelectric conversion medium and the electrodes makes direct contact with the document surface and the like. For this reason, a friction is introduced when the document moves in a sub scanning direction, and the photoelectric conversion part may become damaged due to the friction. In addition, in order to obtain from the photoelectric conversion part an electrical signal in accordance with picture elements which describe an image on the document when the image is decomposed into dots, it is necessary to provide switches for selecting the electrode pairs and a driving circuit for successively driving the switches. The switches and the driving circuit must be provided independently on the substrate and be connected to the photoelectric conversion part by a plurality of conductor lines. As a result, there are problems in that the apparatus as a whole becomes bulky and a large number of assembling processes are required to produce the apparatus. As a measure of eliminating these problems, there is a method of covering the photoelectric conversion part by a wear-resistant protecting layer, providing the switches and the driving circuit in a vicinity of the photoelectric conversion part, and connecting the switches and the driving circuit to the photoelectric conversion part by a wire bonding or a tape wire or carrier. However, when such connecting means are used, a stepped portion is formed at the connecting part, and there is a problem in that a disconnection is easily formed at the connecting part upon contact with the document surface. On the other hand, when the protecting layer is formed on the photoelectric conversion part and the connecting part to such a thickness that the stepped portion will not occur, there is a problem in that the optical resolution becomes deteriorated because of the thick protecting layer.

FIG. 1 shows an example of the conventional contact photoelectric conversion apparatus. The photoelectric conversion apparatus comprises a substrate 11, a photoelectric conversion part 12, a driving circuit 13, and a wire bonding 14 which connects the photoelectric conversion part 12 and the driving circuit 13. In this case, a distance d between a top surface of the substrate 11 and an upper end of the wire bonding 14, that is, a height difference at the connecting part, is 100 $\lambda$m or over even at the minimum, and the distance d is normally in the order of 400 $\mu$m.

When a protecting layer is formed on the connecting part so as to prevent a disconnection at the connecting part upon direct contact with the document surface, the protecting layer becomes thick and a distance between a top surface of the protecting layer and a top surface of the photoelectric conversion part 12 becomes 100 $\mu$m or over even at the minimum. Accordingly, when the protecting layer is formed on the photoelectric conversion part 12 so as to eliminate the height difference between the top surface of the protecting layer and the top surface of the photoelectric conversion part 12, the protecting layer on the photoelectric conversion part 12 becomes thick and the optical resolution deteriorates. According to experiments conducted by the present inventor, it has been confirmed that the optical resolution greatly deteriorates when the thickness of the protecting layer on the photoelectric conversion part 12 is 100 $\mu$m or over, as shown in FIG. 2, MTF denotes the modulation transfer function.

The problems described before are eliminated if the photoelectric conversion part and the connecting part were formed on the substrate at positions sufficiently separated from each other, by a minimum of 5 mm and preferably 10 mm or over. But in this case, there is a problem in that the apparatus as a whole becomes bulky because of the large substrate area that would be required. In addition, when the substrate area increases, the cost of the materials used for the apparatus increases due to the necessity to use more substrate material and materials related to lithography used when forming patterns on the substrate. Moreover, during a process of forming a thin film in a vacuum apparatus, for example, the processing quantity per batch decreases. Therefore, there is also a problem in that the apparatus becomes expensive.

SUMMARY OF THE INVENTION

Accordingly, it is a general object of the present invention to provide a novel and useful contact photoelectric conversion apparatus in which the problems described heretofore are eliminated.

Another and more specific object of the present invention is to provide a contact photoelectric conversion apparatus which is uneasily damaged, has a high reliability, is compact, and can be produced at a low cost.

Still another object of the present invention is to provide a photoelectric conversion apparatus in which a connection between a photoelectric conversion part and a driving circuit is short in distance so that the photoelectric conversion part can be driven at a high speed, and it is possible to obtain a high resolution and a high signal-to-noise ratio.

A further object of the present invention is to provide a photoelectric conversion apparatus comprising an insulating and transparent substrate, a plurality of photoelectric conversion elements formed on the substrate in a line, selection switches made up of thin film transistors formed on the substrate for selecting the photoelectric conversion elements, a driving circuit made up of thin film transistors formed on the substrate for driving the selection switches, and a wear-resistant and transparent protecting layer formed at least on the photoelectric conversion elements. According to the apparatus of the present invention, there is no connecting part which is formed independently, the apparatus as a whole can be made compact, and the apparatus can be produced at a low cost. In addition, the apparatus has a high reliability because the photoelectric conversion elements are uneasily damaged. Furthermore, because the connection between the photoelectric conversion elements and the driving circuit is short, it is possible to drive the photoelectric conversion elements at a high speed and obtain a high resolution and a high signal-to-noise ratio.

Other objects and further features of the present invention will be apparent from the following detailed description when read in conjunction with the accompanying drawings.

DETAILED DESCRIPTION

Figure 1:
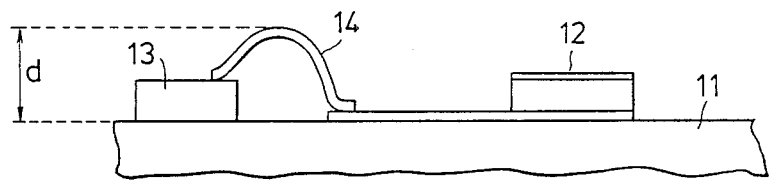
FIG. 1 is a cross sectional view showing an example of the conventional contact photoelectric conversion apparatus.
Figure 2:
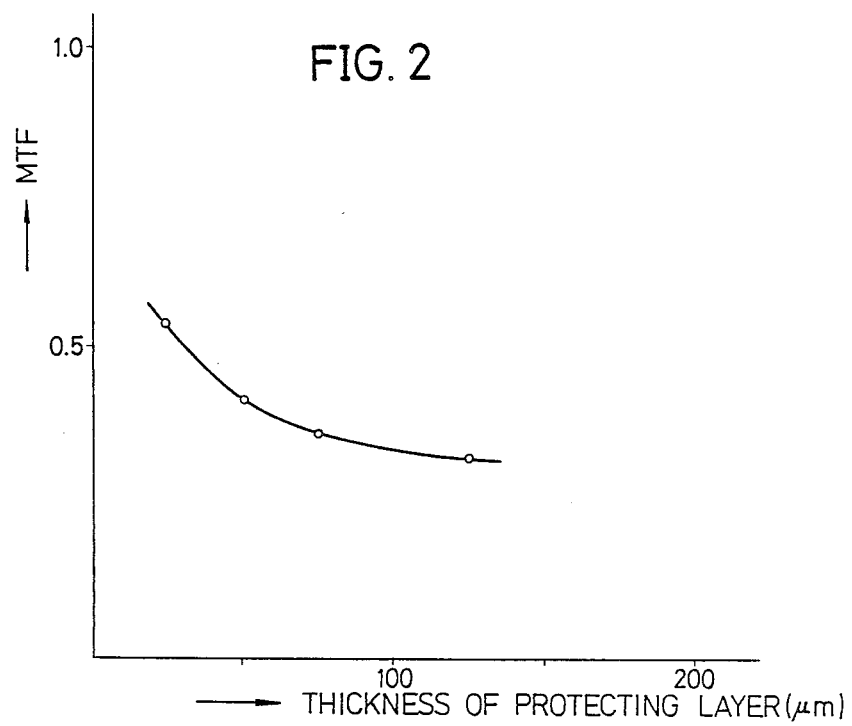
FIG. 2 shows a relationship between the thickness of a protecting layer and the optical resolution.
Figure 3:
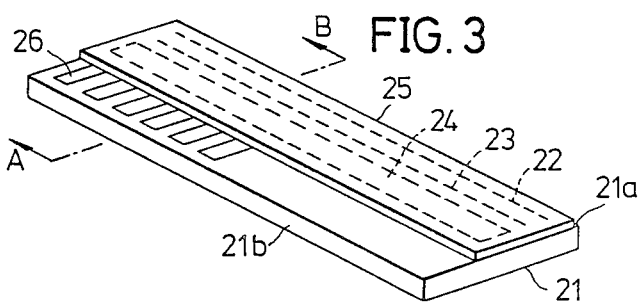
FIG. 3 is a perspective view showing an embodiment of the contact photoelectric conversion apparatus according to the present invention.

FIG. 3 shows a perspective view of an embodiment of the contact photoelectric conversion apparatus according to the present invention. The contact photoelectric conversion apparatus comprises an insulating and transparent substrate 21 made of silica glass or the like, a plurality of photoelectric conversion elements 22 formed along a side 21a of the substrate 21 at predetermined intervals on the substrate surface in a line along a main scanning direction, a plurality of selection switches 23 formed on the substrate surface in correspondence with and adjacent to the photoelectric conversion elements 22 toward a direction of a side 21b of the substrate 21, and a driving circuit 24 comprising a shift register and the like formed on the substrate surface adjacent to the selection switches 23 toward the direction of the side 21b of the substrate 21. A wear-resistant and transparent protecting layer 25 is formed on the photoelectric conversion elements 22, the selection switches 23 and the driving circuit 24. Terminals 26 through which the electrical signals from the photoelectric conversion elements 22 are obtained and to which a power source voltage and clock pulses are applied are formed on the substrate surface in the vicinity of the side 21b.

Accordingly, when the photoelectric conversion elements 22 make contact with a document surface 45 and the like through the protecting layer 25 and the document surface 45 is illuminated by an illuminating light through the back surface of the substrate 21, the illuminating light is transmitted through the substrate 21 and the protecting layer 25, and the reflected light from the document surface 45 is received by the photoelectric conversion elements 22 to be converted into an electrical signal. The selection switches 23 successively select and drive the photoelectric conversion elements 22 from one end to the other when the driving circuit 24 drives the selection switches 23, and the electrical signal is successively obtained from each of the photoelectric conversion elements 22. The main scanning of the document is carried out by repeating the operation of successively and selectively driving the photoelectric conversion elements 22, and the sub scanning of the document is carried out by moving the document in a direction perpendicular to the linearly arranged photoelectric conversion elements 22.

Figure 4:
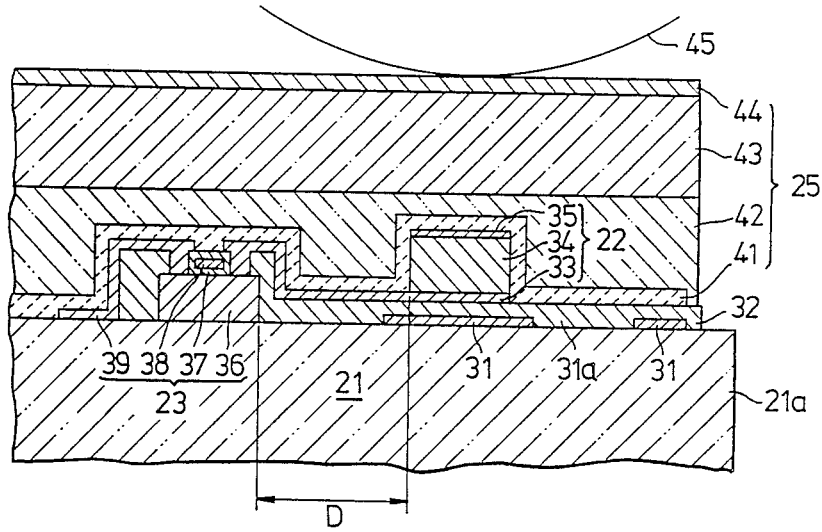
FIG. 4 is a cross sectional view showing an essential part of the embodiment shown in FIG. 3 along a line A-B.
Figure 5:
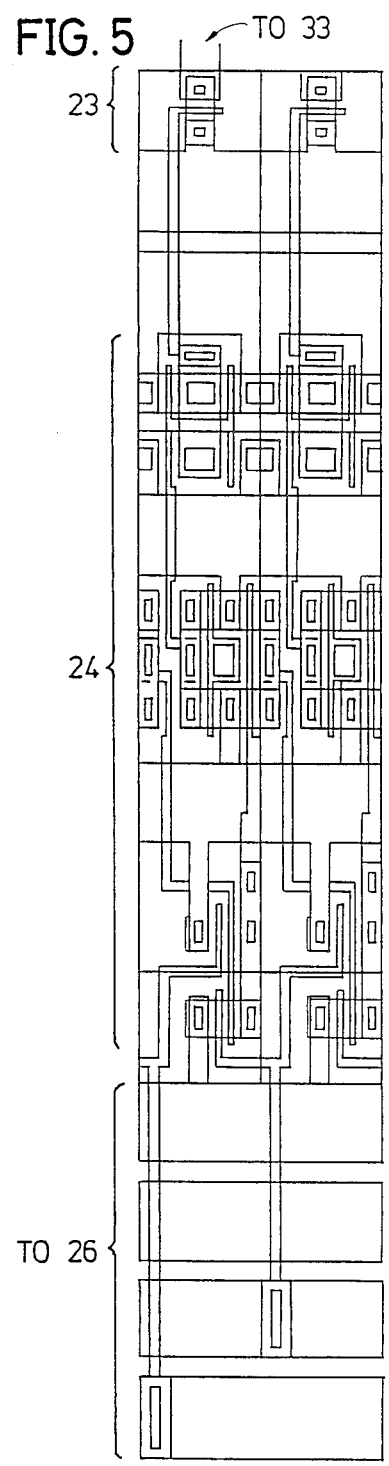
FIG. 5 is a plan view showing an essential part of the embodiment shown in FIG. 3.

FIG. 4 is a cross sectional view on an enlarged scale showing an essential part of the apparatus along the line A-B in FIG. 3. FIG. 5 is a plan view showing an essential part of the embodiment shown in FIG. 3. As shown in FIG. 5, the construction of especially the driving circuit 24 is extremely complex, and for this reason, the illustration of the driving circuit 24 and the terminals 26 is omitted in FIG. 4. In FIGS. 4 and 5, those parts which are the same as those corresponding parts in FIG. 3 are designated by the same reference numerals.

First, in FIG. 4, a light stopping layer 31 made of chromium (Cr) is formed on the substrate surface in the vicinity of the side 21a of the substrate 21 which has a thickness of 1.0 mm and is made of silica glass. Then, light transmitting windows 31a are formed in the light stopping layer 31. Next, an insulating layer 32 made of silicon dioxide ($SiO_2$) is formed on the light stopping layer 31. A chromium (Cr) layer, an amorphous silicon (Si) layer and an indium tin oxide (ITO, InSnO) are successively formed on the insulating layer 32 above the light stopping layer 31 to respectively form independent electrodes 33, a photoelectric conversion layer 34 and transparent electrodes 35. The independent electrodes 33, the photoelectric conversion layer 34 and the transparent electrodes 35 constitute the photoelectric conversion elements 22.

An activation layer 36 made of polysilicon, a gate insulating layer 37 and electrodes 38 are successively formed on the substrate surface at a position separated by a distance D of 500 $\mu$m from the photoelectric conversion elements 22. Sources 39 are formed on the activation layer 36. The activation layer 36, the gate insulating layer 37, the electrodes 38 and the sources 39 constitute thin film transistors which are used for the selection switches 23. The independent electrodes 33 are connected to drains of the thin film transistors. In addition, the sources 39 and gate electrodes 38 of the thin film transistors are connected to the driving circuit 24 constituted by thin film transistors which are formed similarly on the substrate surface.

A transparent first protecting layer 41 made of silicon nitride ($Si_3N_4$) is formed on the photoelectric conversion elements 22, the selection switches 23 and the driving circuit 24 by a plasma chemical vapor deposition (CVD) to a thickness of 2 $\mu$m. An adhesive agent such as Loctite 359 manufactured by Loctite of Japan is formed on the first transparent protecting layer 41 to a thickness of 7 $\mu$m so as to form an adhesive layer 42. In addition, a glass such as Corning #0211 manufactured by Corning of U.S.A. is formed on the adhesive layer 42 to a thickness of 90 $\mu$m so as to form a second protecting layer 43.

A transparent wear-resistant layer 44 is formed by forming silicon nitride ($Si_3N_4$) on the protecting layer 43 by a plasma CVD to a thickness of 3 μm. The adhesive layer 42 is subjected to a hardening process using ultraviolet radiation, and the protecting layers 41 and 43 are completely adhered to each other.

Thus, according to the construction of the present embodiment, the thickness of the thin film transistors is in a range of 0.5 μm to 5 μm, and the photoelectric conversion elements 22, the selection switches 23 and the driving circuit 24 can be formed on the same substrate 21. For this reason, it is unnecessary to independently provide a connection part for electrically connecting these parts of the apparatus. In addition, the mutual separation of the photoelectric conversion elements 22, the selection switches 23 and the driving circuit 24 is reduced, and the photoelectric conversion elements 22 can be driven at a high speed.

Since the protecting layer 41 through the wear-resistant layer 44 which constitute the protecting layer 25 are successively formed on the photoelectric conversion elements 22, the selection switches 23 and the driving circuit 24, the photoelectric conversion element 22 are prevented from being damaged even when the apparatus makes contact with the document surface 45. Further, the apparatus can make smooth contact with the document surface 45, and the reliability of the apparatus is high.

Figure 6:
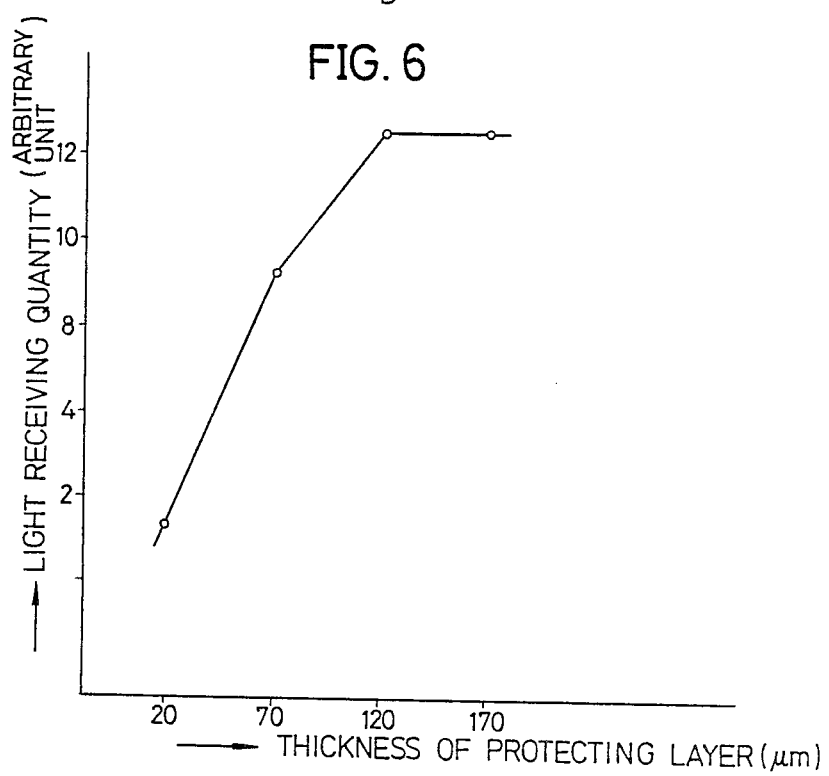
FIG. 6 shows a relationship between the thickness of the protecting layer and the light receiving quantity of photoelectric conversion elements.

The protecting layer 41 through the wear-resistant layer 44 transmit the illuminating light received from the back surface of the substrate 21 through the light transmitting windows 31a to the document surface 45, and also transmit the reflected light from the document surface 45 to the photoelectric conversion elements 22. Hence, out of the wavelengths included in the illuminating light, the protecting layer 41 through the wear-resistant layer 44 must be transparent with respect to the wavelengths to which the photoelectric conversion elements 22 are sensitive. According to the experiments conducted by the present inventor, it has been found that the resolution and the signal-to-noise ratio are satisfactory when a total thickness of the protecting layer 41 through the wear-resistant layer 44 is in a range of 4 μm to 200 μm, and that the resolution and the signal-to-noise ratio are especially satisfactory when the total thickness is in a range of 20 μm to 100 μm. Thus, the total thickness of the protecting layer 41 through the wear-resistant layer 44, that is, the thickness of the protecting layer 25, is set to approximately 100 μm in the present embodiment. FIG. 6 shows the relationship between the thickness of the protecting layer 25 and the light receiving quantity of the photoelectric conversion elements 22, where the ordinate indicates the light receiving quantity in an arbitrary unit. The signal level which determines the signal-to-noise ratio is dependent on the light receiving quantity of the photoelectric conversion elements 22, but the noise which determines the signal-to-noise ratio is independent of the thickness of the protecting layer 25.

In actual practice, it is difficult to form a transparent layer of 20 μm to 100 μm by a CVD, an evaporation and the like. From this point of view, it is preferable to adhere as the protecting layer 43 a glass having formed thereon the wear-resistant layer 44. In this case, it is desirable to set the thickness of the glass to 4 μm to 200 μm because the protecting layer 43 constitutes a large portion of the total thickness of the protecting layer 25.

The characteristic of the part of the apparatus including the photoelectric conversion elements 22 and the thin film transistors becomes deteriorated by natrium ($Na^+$) ions and the like. In order to prevent this characteristic from deteriorating, the protecting layer 41 is formed, and the transparent adhesive layer 42 is formed to fill the uneven gap between the protecting layer 43 and the wear-resistant layer 44, so that the transmission of the light through the protecting layer 25 is satisfactory and the connection of the layers 41 and 43 is complete. The $Na^+$ ions easily enter the photoelectric conversion elements 22 and the thin film transistors when touched by a hand of a person or due to sea breeze and the like.

On the other hand, a pressure is applied on the part of the apparatus having the photoelectric conversion elements 22 when the apparatus makes contact with the document surface 45, and this pressure is also applied on the selection switches 23. For this reason, when the distance D between the photoelectric conversion elements 22 and the selection switches 23 is small, the threshold voltage $V_{th}$ and the ON/OFF resistance of the thin film transistors may change after the apparatus is used for a long period of time due to the applied pressure. Since the part of the apparatus having the photoelectric conversion elements 22 is not simply applied with the pressure but is also subject to a friction as the document (paper) moves while making sliding contact with the surface of the apparatus, the surface of the thin film transistors may be charged by the friction which is introduced as the document slides on the surface of the apparatus. As a result, the effective value of the voltage applied to the gate electrodes of the thin film transistors may change. The change in the ON/OFF resistance of the thin film transistors are caused by the change in the effective value of the voltage applied to the gate electrodes, piezoelectric effect and the like. According to experiments conducted by the present inventor, it has been found that the undesirable effects of the pressure applied on the apparatus are avoidable when the distance D is set to 100 μm or over, and that the undesirable effects are completely eliminated when the distance D is set to 500 μm or over.

According to the construction of the present embodiment, the resolution modulation transfer function (MTF) or the space frequency characteristic and the signal-to-noise ratio were found to be 55% and 28 dB, respectively, and no abnormalities were found even after scanning of 5000 sheets of paper, when the photoelectric conversion characteristic were measured with the contact pressure of the document surface 45 set to 3 kg and the moving speed of the document in the sub scanning direction set to 59 mm/sec.

The thin film transistors may be formed from materials other than the polysilicon, amorphous silicon and the like, such as tellurium (Te) and cadmium sulfide (CdS). In addition, phosphor silicate glass may be used for the protecting layer 41. It is possible to form the wear-resistant layer 44 by forming a diamond thin film and the like by a CVD. Although it is preferable to use glass for the protecting layer 43 since scratches are uneasily made thereon, it is possible to use other materials such as a transparent plastic film.

According to the present invention, the photoelectric conversion elements are formed in a line on the insulating and transparent substrate, the selection switches and the driving circuit made up of the thin film transistors are formed on the substrate, and the wear-resistant and transparent protecting layer is formed at least on the surface of the photoelectric conversion elements. As a result, there is no connecting part which is formed independently, the apparatus as a whole can be made compact, and the apparatus can be produced at a low cost. In addition, the apparatus has a high reliability because the photoelectric conversion elements are uneasily damaged. Furthermore, because the connection between the photoelectric conversion elements and the driving circuit is short, it is possible to drive the photoelectric conversion elements at a high speed and obtain a high resolution and a high signal-to-noise ratio. These superior effects of the present invention become notable especially when carrying out a photoelectric conversion by optically scanning the document surface, card surface and the like by making contact therewith.

Further, the present invention is not limited to these embodiments, but various variations and modifications may be made without departing from the scope of the present invention.

What is claimed is:

1. A contact photoelectric conversion apparatus comprising:
   an insulating and transparent substrate;
   a plurality of photoelectric conversion elements formed in a line on said insulating and transparent substrate;
   selection switches comprising a plurality of first thin film transistors formed on said insulating and transparent substrate for selecting said photoelectric conversion elements;
   a driving circuit comprising a plurality of second thin film transistors formed on said insulating and transparent substrate for driving said photoelectric conversion elements through said selection switches; and
   a wear-resistant and transparent protecting layer formed at least on said photoelectric conversion elements, said protecting layer including first transparent protecting layer formed on said photoelectric conversion elements, an adhesive layer formed on said first transparent protecting layer, a second transparent protecting layer formed on said adhesive layer, and a transparent wear-resistant layer formed on said second transparent protecting layer.

2. A contact photoelectric conversion apparatus as claimed in claim 1 in which a distance between said photoelectric conversion elements and said selection switches is 100 μm or over along a sub scanning direction of the contact photoelectric conversion apparatus.

3. A contact photoelectric conversion apparatus as claimed in claim 1 in which said wear-resistant and transparent protecting layer is formed on said photoelectric conversion elements and said selection switches.

4. A contact photoelectric conversion apparatus as claimed in claim 1 in which said second transparent protecting layer has a thickness in a range of 4 μm to 200 μm.

5. A contact photoelectric conversion apparatus as claimed in claim 1 in which a total thickness of said first transparent protecting layer through said transparent wear-resistant layer is in a range of 4 μm to 200 μm.

6. A contact photoelectric conversion apparatus comprising:
   an insulating and transparent substrate;
   a plurality of photoelectric conversion elements formed in a line on said insulating and transparent substrate;
   selection switches comprising a plurality of first thin film transistors formed on said insulating and transparent substrate for selecting said photoelectric conversion elements, a distance between said photoelectric conversion elements and said selection switches is 100 μm over along a sub scanning direction of the contact photoelectric conversion apparatus;
   a driving circuit comprising a plurality of second thin film transistors formed on said insulating and transparent substrate for driving said photoelectric conversion elements through said selection switches; and
   a wear-resistant and transparent protecting layer formed at least on said photoelectric conversion elements.

7. A contact photoelectric conversion apparatus as claimed in claim 6 in which said wear-resistant and transparent protecting layer is formed on said photoelectric conversion elements and said selection switches.

8. A contact photoelectric conversion apparatus as claimed in claim 6 in which said protecting layer comprises a first transparent protecting layer formed on said photoelectric conversion elements, an adhesive layer formed on said first transparent protecting layer, a second transparent protecting layer formed on said adhesive layer, and a transparent wear-resistant layer formed on said second transparent protecting layer.

9. A contact photoelectric conversion apparatus as claimed in claim 8 in which said second transparent protecting layer has a thickness in a range of 4 μm to 200 μm.

10. A contact photoelectric conversion apparatus as claimed in claim 8 in which a total thickness of said first transparent protecting layer through said transparent wear-resistant layer is in a range of 4 μm to 200 μm.

11. A contact photoelectric conversion apparatus as claimed in claim 6 in which said wear-resistant and transparent protecting layer has a thickness in a range of 4 μm to 200 μm.

* * * * *